US012658568B2

(12) United States Patent
Ahn et al.

(10) Patent No.: US 12,658,568 B2
(45) Date of Patent: Jun. 16, 2026

(54) BUILT-IN ANTENNA

(71) Applicants:HYUNDAI MOBIS CO., LTD., Seoul (KR); WINNERCOM CO., LTD., Gimhae-si (KR)

(72) Inventors: Jung Sun Ahn, Yongin-si (KR); Kyung Sup Shin, Yongin-si (KR); Seung Hee Han, Yongin-si (KR); Young Kyun Oh, Suwon-si (KR); Jae Hoon Jung, Suwon-si (KR); Seong Min Jeong, Suwon-si (KR); Byeong Chan Yu, Suwon-si (KR)

(73) Assignees: HYUNDAI MOBIS CO., LTD., Seoul (KR); WINNERCOM CO., LTD., Gimhae-si (KR)

( * ) Notice: Subject to any disclaimer, the term of this patent is extended or adjusted under 35 U.S.C. 154(b) by 69 days.

(21) Appl. No.: 18/585,172

(22) Filed: Feb. 23, 2024

(65) Prior Publication Data

US 2024/0421491 A1 Dec. 19, 2024

(30) Foreign Application Priority Data

Jun. 13, 2023 (KR) ........................ 10-2023-0075348

(51) Int. Cl.
 *H01Q 21/28* (2006.01)
 *H01Q 1/32* (2006.01)
 (Continued)
(52) U.S. Cl.
 CPC .............. *H01Q 1/32* (2013.01); *H01Q 1/3275* (2013.01); *H01Q 1/521* (2013.01); (Continued)
(58) Field of Classification Search
 CPC .. H05K 1/14; H05K 6/366; H01Q 1/32–3291; H01Q 1/52–528; (Continued)

(56) References Cited

U.S. PATENT DOCUMENTS 5,936,579 A * 8/1999 Kapitsyn ............ H01Q 21/0075
 343/846
8,810,457 B2 8/2014 Flores-Cuadras et al.
 (Continued)

FOREIGN PATENT DOCUMENTS

KR 102151120 B1 * 9/2020 ............. H01Q 9/065
WO WO-2014206111 A1 * 12/2014 ............. H01Q 1/243
WO WO-2023016180 A1 * 2/2023 ............. H01Q 7/005

OTHER PUBLICATIONS

European Search report issued on Sep. 24, 2024 for corresponding EP Patent Application No. 24159892.9.

*Primary Examiner* — Ab Salam Alkassim, Jr.

(74) *Attorney, Agent, or Firm* — NovoTechIP International PLLC

(57) ABSTRACT

A built-in antenna includes a first printed circuit board (PCB) having antenna areas arranged so that at least one antenna area is arranged at each of the corners of the first PCB. The antenna areas are spaced apart from one another, and circuit components are arranged in areas other than the antenna areas. A second PCB has first antenna patterns respectively arranged at locations corresponding to the antenna areas on the first PCB. A third PCB is vertically coupled to the first and second PCBs to electrically connect them. The second PCB includes a second antenna pattern arranged in an area other than areas in which the first antenna patterns are arranged. This increases a degree of freedom in design and improves bandwidth and efficiency by arranging each antenna in a plate-shaped structure.

8 Claims, 4 Drawing Sheets

(51) Int. Cl.

| | |
|---|---|
| *H01Q 1/52* | (2006.01) |
| *H01Q 9/04* | (2006.01) |
| *H05K 1/14* | (2006.01) |
| *H05K 3/36* | (2006.01) |

(52) U.S. Cl.
CPC ........... *H01Q 9/0414* (2013.01); *H01Q 21/28* (2013.01); *H05K 1/14* (2013.01); *H05K 3/366* (2013.01)

(58) Field of Classification Search
CPC .... H01Q 9/0414; H01Q 21/28; H01Q 19/108; H01Q 21/062; H01Q 21/26; H01Q 9/16; H01Q 9/285
See application file for complete search history.

(56) References Cited

U.S. PATENT DOCUMENTS

| | | | | |
|---|---|---|---|---|
| 10,522,909 | B2 * | 12/2019 | Martiskainen | H01Q 1/243 |
| 2014/0285382 | A1 * | 9/2014 | Dobric | H01Q 9/0414 |
| | | | | 343/700 MS |
| 2014/0361941 | A1 * | 12/2014 | Jenwatanavet | H01Q 5/328 |
| | | | | 343/722 |
| 2015/0364820 | A1 * | 12/2015 | Dong | H01Q 5/10 |
| | | | | 343/729 |
| 2016/0105963 | A1 * | 4/2016 | Isom | H01Q 1/50 |
| | | | | 343/906 |
| 2017/0033471 | A1 * | 2/2017 | Huang | H01Q 1/2291 |
| 2018/0342807 | A1 * | 11/2018 | Watson | H01Q 9/0421 |
| 2019/0386385 | A1 * | 12/2019 | Filatov | H01Q 1/325 |
| 2020/0411964 | A1 * | 12/2020 | Li | H01Q 1/246 |
| 2022/0239005 | A1 * | 7/2022 | Seong | H01Q 21/28 |
| 2023/0031896 | A1 * | 2/2023 | Kim | H01Q 21/28 |
| 2023/0096365 | A1 * | 3/2023 | Mikami | H04B 1/38 |
| | | | | 370/316 |
| 2023/0145095 | A1 * | 5/2023 | Onaka | H04B 1/3827 |
| | | | | 455/73 |
| 2023/0231304 | A1 * | 7/2023 | Arendt | H05K 1/142 |
| | | | | 343/713 |
| 2024/0021979 | A1 * | 1/2024 | Shin | H01Q 21/28 |
| 2024/0113422 | A1 * | 4/2024 | Li | H01Q 21/24 |

* cited by examiner

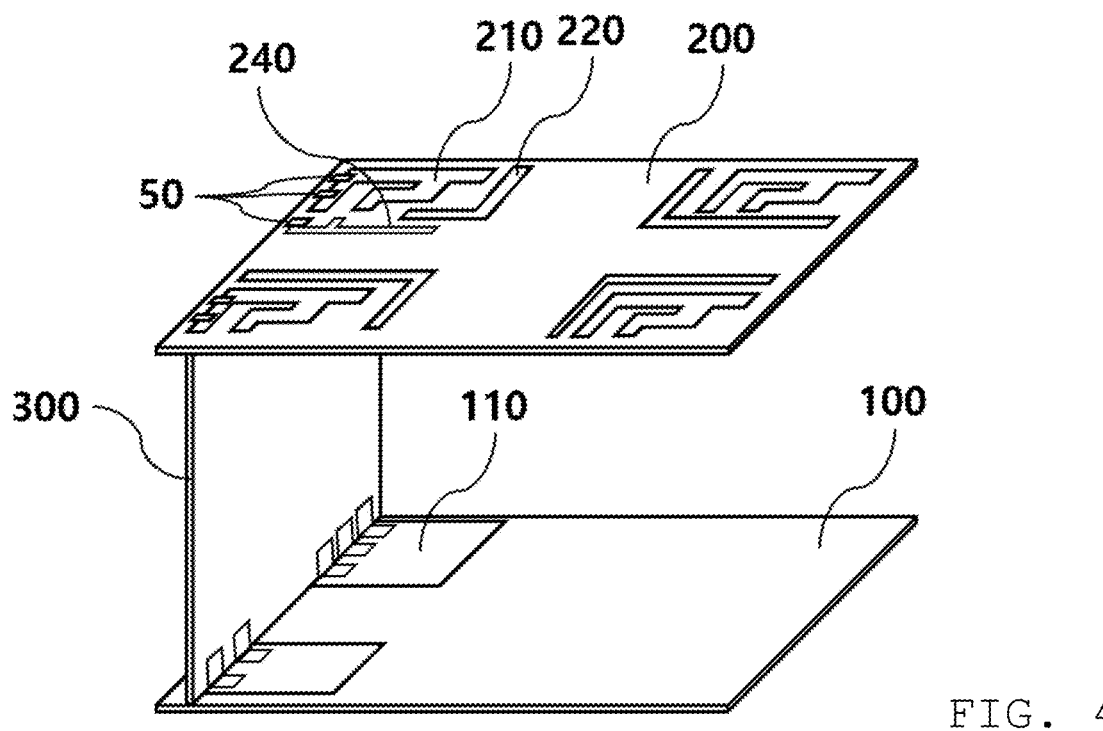
FIG. 4
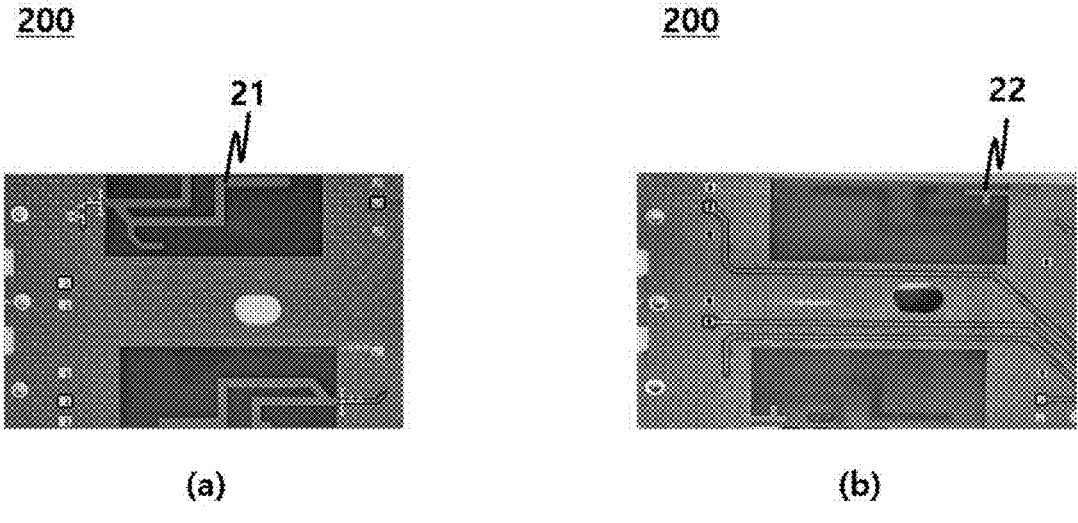
(a)
(b)
FIG. 5A                    FIG. 5B

BUILT-IN ANTENNA

CROSS-REFERENCE TO RELATED APPLICATIONS

The present application claims priority to Korean Patent Application No. 10-2023-0075348, filed Jun. 13, 2023, the entire contents of which is incorporated herein for all purposes by this reference.

TECHNICAL FIELD

The present disclosure relates to a built-in antenna, and more particularly, to a built-in antenna installed in a vehicle.

BACKGROUND

An audio, video, navigation (AVN) system installed in a vehicle, that is, a head unit, is a multimedia system that integrates an audio unit, a video unit, a telematics unit including navigation, and the like into one unit, and not only provides user convenience for intensive operation of various multimedia devices, but also provides the advantage of efficiently utilizing space such as a vehicle's instrument panel and center fascia.

To provide services such as GPS for navigation, a universal mobile telecommunications system (UMTS) for telematics, and digital multimedia broadcasting (DMB)/digital audio broadcasting (DAB)/satellite digital audio radio service (SDARS) for broadcasting which are included in the head unit as described above, an external roof antenna is installed on a roof panel of a vehicle.

The external loop antenna is mounted and fixed on the roof panel and is connected to a transmitting/receiving unit included in the head unit by a coaxial cable to enable signal exchange. The process of mounting the external roof antenna is accomplished by inserting a bolt integrally formed or mounted on a bottom surface of a base of the roof antenna into a roof hole of the roof panel and then tightening a nut from the bottom of the roof panel. Accordingly, the service signal detected from the external loop antenna is transmitted to the transmitting/receiving unit included in the head unit through the coaxial cable, and acquires telematics and broadcasting information, including navigation of the head unit.

However, the conventional external loop antenna has the following problems.

First, although the external loop antenna and the transmitting/receiving unit of the head unit are connected by the coaxial cable to provide each service, in order to apply a system that requires two or more antennas, such as long term evolution (LTE) or vehicle-to-X [V2X (vehicle or infrastructure)], more coaxial cables are required. As a result, there is a possibility that signal attenuation and deterioration due to the signal attenuation may occur due to the adoption of many coaxial cables.

Second, in order to assemble the external roof antenna to the roof panel, since the bolt formed on the antenna base of the external roof antenna is inserted into the roof hole and then mounted on a car body using the nut from the inside of the car body, in order to secure watertight performance after assembly, a separate pad should be installed on the antenna and then the nut should be tightened, so there is a risk that assembly workability is poor and waterproof performance may decrease due to aging of the pad.

Third, since the entire antenna module should be developed according to the design and color specifications of the external loop antenna, various loop antenna specifications should be developed for each vehicle type, and the number of coaxial cables increases according to wireless specifications, so there is a disadvantage in that the number of antennas, which may be integrated, is limited and scalability is poor.

In order to solve the above-described problems, development of built-in antennas has recently been made. However, the currently commercially available built-in antenna is constructed by designing each antenna as a single structure in a limited space. Accordingly, there is a problem in that a bandwidth of a general monopole-type open resonator is narrow and it is difficult to expand the bandwidth, and since the bandwidth should be expanded by adding a complex pattern within a limited effective area, there is a problem in that radiation performance is degraded.

SUMMARY

An embodiment of the present invention is directed to increasing a degree of freedom in design and improving bandwidth and efficiency by arranging each antenna in a plate-shaped structure.

In one general aspect, the built-in antenna includes: a first printed circuit board (PCB) that is arranged at a corner, includes at least one antenna area arranged to be spaced apart by a predetermined distance, and has circuit components arranged in areas other than the antenna area; a second PCB that has a first antenna pattern arranged at a location corresponding to the antenna area; and a third PCB that is vertically coupled to the first PCB and the second PCB to electrically connect the first PCB and the second PCB, in which the second PCB may include an additional pattern area in which at least one second antenna pattern is arranged in the areas other than the area in which the first antenna pattern is arranged.

The second PCB may have an auxiliary pattern arranged at a location adjacent to the first antenna pattern.

The auxiliary pattern may be formed of copper foil.

The third PCB may connect a feeding unit included in the antenna area and a feeding unit of the first antenna pattern.

When the second antenna pattern is arranged on the second PCB, the third PCB may connect a feeding unit included in the first PCB and a feeding unit of the second antenna pattern.

The second antenna pattern may be spaced from the first antenna pattern by a certain distance and may be arranged in a cross shape.

The second antenna pattern may be short-circuited from the first PCB through the third PCB.

The first and second antenna patterns may include a short-circuited resonator and an open resonator.

The open resonator may be arranged on a first surface of the second PCB, and the short-circuited resonator may be arranged on a second surface of the second PCB.

BRIEF DESCRIPTION OF THE DRAWINGS

FIG. 4 illustrates a structure in which the first PCB, the second PCB, and the third PCB are combined.

FIGS. 5A and 5B illustrate arrangements having an open resonator and an short-circuit resonator on the second PCB according to another embodiment of the present invention.

DETAILED DESCRIPTION

Figure 1:
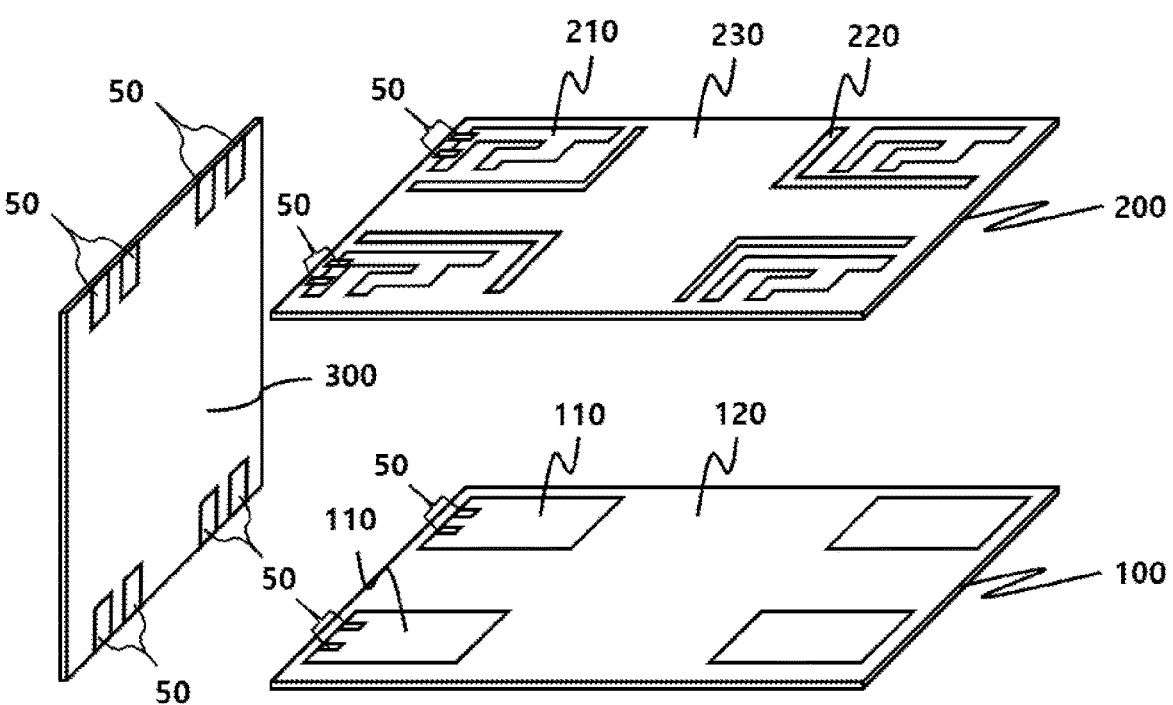
FIG. 1 is a configuration diagram of a built-in antenna according to an embodiment of the present invention.

The above-described objects, features, and advantages of the present disclosure will become more obvious from the following detailed description provided in relation to the accompanying drawings. The following specific structural or functional descriptions are only exemplified for the purpose of describing the embodiments according to the concept of the present invention, and the embodiments according to the concept of the present invention may be implemented in various forms and should not be construed as limited to the embodiments described herein or in the application. Since embodiments according to the concept of the present disclosure may be variously modified and may have several forms, specific embodiments will be illustrated in the accompanying drawings and will be described in detail in the present specification or application. However, it is to be understood that the present disclosure is not limited to specific embodiments, but includes all modifications, equivalents, and substitutions falling in the spirit and the scope of the present disclosure. Terms such as 'first', 'second', or the like, may be used to describe various components, but these components are not to be construed as being limited to these terms. The terms are used only to distinguish one component from another component. For example, a first component may be named a second component and the second component may also be named the first component, without departing from the scope of the present invention. It is to be understood that when one component is referred to as being connected to or coupled to another component, it may be connected directly to or coupled directly to another component or be connected to or coupled to another component with the other component interposed therebetween. On the other hand, it is to be understood that when one component is referred to as being connected directly to or coupled directly to another component, it may be connected to or coupled to another component without the other component interposed therebetween. Other expressions for describing the relationship between components, such as between and immediately between or adjacent to and directly adjacent to, etc., should be interpreted similarly. Terms used in the present specification are used only in order to describe specific embodiments rather than limiting the present disclosure. Singular forms are intended to include plural forms unless the context clearly indicates otherwise. It is to be understood that terms "include," "have," or the like, used in the present specification specify the presence of features, numerals, steps, operations, components, parts, or a combination thereof described in the present specification, but do not preclude the presence or addition of one or more other features, numerals, steps, operations, components, parts, or a combination thereof. Unless indicated otherwise, it is to be understood that all the terms used in the specification including technical and scientific terms have the same meaning as those that are generally understood by those who are skilled in the art. Terms generally used and defined in a dictionary are to be interpreted as the same meanings with meanings within the context of the related art, and are not to be interpreted as ideal or excessively formal meanings unless clearly indicated in the present specification. Hereinafter, exemplary embodiments of the present invention will be described in detail with reference to the accompanying drawings. Like reference numerals proposed in each drawing denote like components.

FIG. 1 is a configuration diagram of a built-in antenna according to an embodiment of the present invention.

Referring to FIG. 1, a built-in antenna according to an embodiment of the present invention may include a first PCB 100, a second PCB 200, and a third PCB 300.

First, the first PCB 100 may include at least one antenna area 110 arranged at each corner of the first PCB 100 and spaced apart from one another by a predetermined distance, and circuit component mounting area 120 in which circuit components are arranged in areas other than the antenna area 110. In addition, each antenna area 110 may include a feeding unit 50 for electrical connection. An antenna and antenna components for communication are arranged in the antenna area 110, and circuit components for operating the built-in antenna according to the present invention, such as a resistor and a power supply unit, may be mounted in the circuit component mounting area 120.

The second PCB 200 is arranged to face the first PCB 200 and may include at least one first antenna pattern 210 arranged at a location on the second PCB corresponding to the antenna area 110 of the first PCB 100. The second PCB also includes an additional pattern area 230 in which other separate antenna patterns may be arranged. In addition, the second PCB 200 may have an auxiliary pattern 220 arranged at a location adjacent to the first antenna pattern 210 to secure isolation of each antenna. The auxiliary pattern 220 may be formed of copper foil and may assist in improving the performance of the built-in antenna by securing the isolation of each antenna. In addition, the first antenna pattern 210 may include a feeding unit 50 for electrical connection.

The third PCB 300 may be vertically coupled between the first PCB 100 and the second PCB 200. In addition, the third PCB 300 includes a feeding unit 50 to connect the antenna area 110 of the first PCB 100 and a feeding unit of the first antenna pattern 210 of the second PCB 200 and may electrically connect the first PCB 100 and the second PCB 200. In addition, the third PCB 300 may be provided in plural numbers to connect each antenna area 110 and the feeding unit 50 of the first antenna pattern 210.

Figure 2:
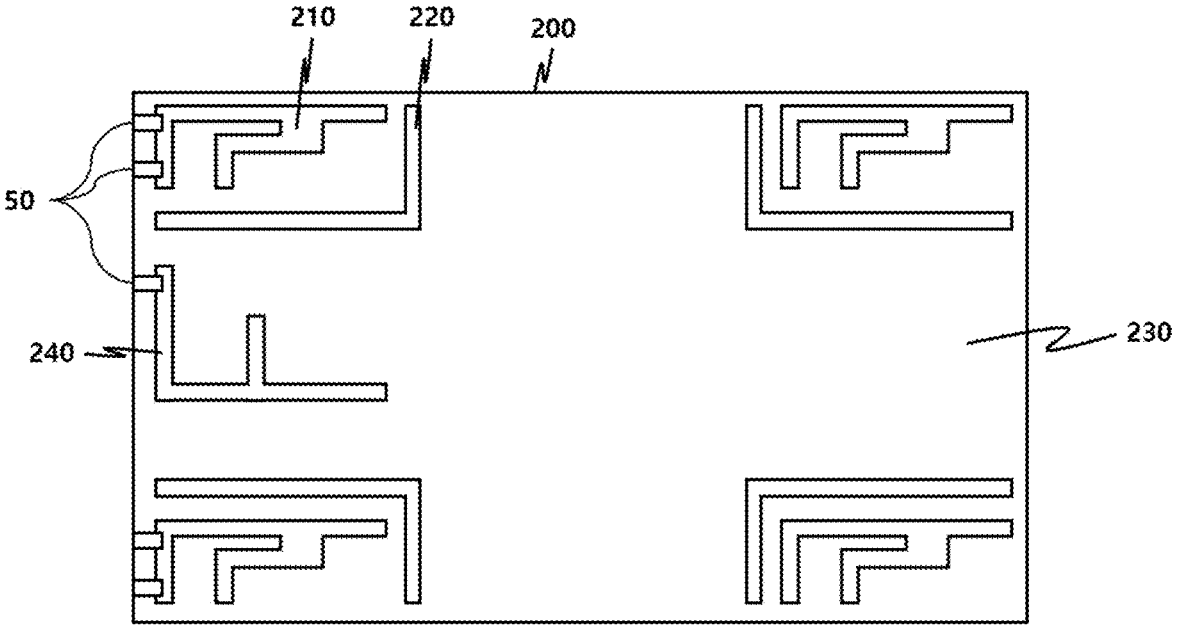
FIG. 2 is a configuration diagram of a second PCB according to an embodiment of the present invention.

FIG. 2 is a configuration diagram of the second PCB 200 according to an embodiment of the present invention.

Referring to FIG. 2, the second PCB 200 according to the embodiment of the present invention may include a first antenna pattern 210, an auxiliary pattern 220, an additional pattern area 230, and a second antenna pattern 240.

The first antenna pattern 210 may be arranged at a location corresponding to the antenna area 110 of the first PCB 100, and electrically connected to the antenna area 110 of the first PCB 100 through the feeding unit 50 and the third PCB 300. The first antenna pattern 210 may be designed so that feeding points of each pattern are located as far away as possible to secure isolation from each other. In addition, each first antenna pattern 210 may be arranged so that beam pattern directions do not overlap each other. A shape and structure of the first antenna pattern 210 may be formed differently according to the embodiment.

The second PCB 200 has a plate-shaped structure, and the second antenna pattern 240 may be arranged as an additional pattern area 230 in the remaining area excluding the area in which the first antenna pattern 210 is arranged, The second antenna pattern 240 is an antenna pattern that performs a different function from the first antenna pattern 210, and the built-in antenna according to the present invention may additionally arrange the second antenna pattern 240 in the additional pattern area 230 to secure an antenna bandwidth and additional functions.

The auxiliary pattern 220 may be arranged at a location adjacent to the first antenna pattern 210 so that the isolation of each first antenna pattern 210 may be secured. The auxiliary pattern 220 may be formed of copper foil to secure the isolation, and may be arranged to surround the first antenna pattern 210. The shape, length, thickness, etc., of the auxiliary pattern 220 may vary differently according to the embodiment.

In addition, the first antenna pattern 210 and the second antenna pattern 40 may include an open (or open-circuit) resonator and a short-circuited resonator. Hereinafter, the configuration of the first antenna pattern 210 to the second antenna pattern 240 will be described in detail with reference to FIG. 3.

Figure 3:
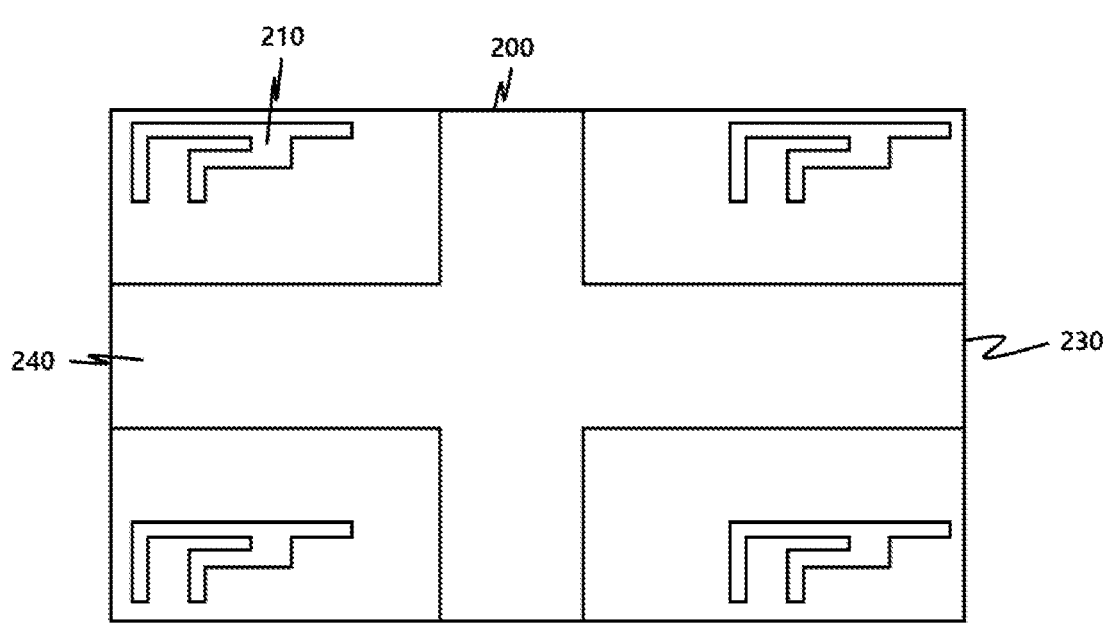
FIG. 3 is a configuration diagram of a second PCB according to another embodiment of the present invention.

FIG. 3 is a configuration diagram of the second PCB 200 according to another embodiment of the present invention.

Referring to FIG. 3, the second PCB 200 according to the embodiment of the present invention may include a first antenna pattern 210, an additional pattern area 230, and a second antenna pattern 240.

The first antenna pattern 210 may be arranged at a location corresponding to the antenna area 110 of the first PCB 100, and electrically connected to the antenna area 110 of the first PCB 100 through the feeding unit 50 and the third PCB 300. The first antenna pattern 210 may be designed so that feeding points of each pattern are located as far away as possible to secure isolation from each other. In addition, each first antenna pattern 210 may be arranged so that beam pattern directions do not overlap each other. The shape and structure of the first antenna pattern 210 may be formed differently according to the embodiment.

The second PCB 200 has a plate-shaped structure, and the second antenna pattern 240 may be arranged as an additional pattern area 230 in the remaining area excluding the area in which the first antenna pattern 210 is arranged, The second antenna pattern 240 is an antenna pattern that performs a different function from the first antenna pattern 210, and the built-in antenna according to the present invention may additionally arrange the second antenna pattern 240 in the additional pattern area 230 to secure an antenna bandwidth and additional functions. In addition, it is possible to improve the isolation of each first antenna pattern 210 by arranging the second antenna pattern 240 on the second PCB 200 in a cross shape. The second antenna pattern 240 may be short-circuited from the first PCB 100 through the third PCB 300. In addition, in some cases, the second antenna pattern 240 may have a structure that operates independently without being connected to the first PCB 100.

FIG. 4 illustrates a structure in which the first PCB 100, the second PCB 200, and the third PCB 300, as shown in FIG. 1, are combined to form a connected structure utilizing the feeding units on the three PCBs to connect the antenna areas and patterns on the respective PCBs.

FIGS. 5A and 5B are exemplary diagrams illustrating a resonator of the second PCB (200) according to an embodiment of the present invention. Referring first to FIG. 5A, on the first surface of the second PCB 200, an open resonator 21 of the first antenna pattern 210 to the second antenna pattern 240 is arranged. The first surface of the second PCB 200 may be, for example, an upper surface (TOP). The open resonator 21 is an open resonator utilizing a signal, in which an impedance circle may be formed toward the open side.

Referring to FIG. 5B, on the second surface of the second PCB 200, a short-circuit resonator 22 of the first antenna pattern 210 to the second antenna pattern 240 may be arranged. The second surface of the second PCB 200 is opposite to the first surface, and may be, for example, a lower surface (BOTTOM). The short-circuit resonator 22 is a short-circuit resonator utilizing a ground, in which an impedance circle may be formed toward the short side. In addition, the first antenna pattern 210 to the second antenna pattern 240 may secure a frequency band of 1.7 GHz or higher, including 5G, by using the short-circuit resonator 22.

Furthermore, the first antenna pattern 210 to the second antenna pattern 240 may implement a MID/HIGH band requiring broadband characteristics by utilizing a coupling pattern of the open resonator 21 and the short-circuit resonator 22.

Although preferred embodiments of the present invention have been described above, the embodiments disclosed in the present invention are only for explaining, not limiting, the technical spirit of the present invention. Accordingly, the technical spirit of the present invention includes not only each disclosed embodiment, but also a combination of the disclosed embodiments, and further, the scope of the technical spirit of the present invention is not limited by these embodiments. In addition, many modifications and alterations of the present disclosure may be made by those skilled in the art to which the present disclosure pertains without departing from the spirit and scope of the accompanying claims. In addition, it is to be considered that all of these modifications and alterations fall within the scope of the present disclosure.

What is claimed is:

1. A built-in antenna comprising:
a first printed circuit board (PCB) including:
a plurality of antenna areas respectively arranged near a plurality of corners of the first PCB and spaced apart from each other, each corner of the first PCB having an individual antenna area; and
a circuit component mounting area arranged outside the plurality of antenna areas;
a second PCB facing and substantially parallel to the first PCB, wherein the second PCB includes a plurality of first antenna patterns arranged respectively at a plurality of locations respectively overlapping the plurality of antenna areas on the first PCB; and
a third PCB arranged substantially perpendicular to the first PCB and the second PCB and having a first feeding unit electrically connecting the plurality of antenna areas of the first PCB respectively to the plurality of first antenna patterns of the second PCB,
wherein the second PCB includes a second antenna pattern arranged at an additional pattern area located outside the plurality of locations of the second PCB in which the plurality of first antenna patterns is respectively arranged, and
wherein the third PCB is connected to and vertically extends between an edge portion of the first PCB and an edge portion of the second PCB.

2. The built-in antenna of claim 1, wherein the second PCB further includes an auxiliary pattern arranged at a location adjacent to at least one of the plurality of first antenna patterns.

3. The built-in antenna of claim 2, wherein the auxiliary pattern is formed of copper foil.

4. The built-in antenna of claim 1, wherein the first feeding unit of the third PCB connects a second feeding unit included in one of the plurality of antenna areas and a third feeding unit of one of the plurality of first antenna patterns.

5. The built-in antenna of claim 1, wherein the second antenna pattern is spaced from one of the plurality of first antenna patterns by a prescribed distance and arranged in a cross shape.

6. The built-in antenna of claim 5, wherein the second antenna pattern is located to be short-circuited to the first PCB through the third PCB.

7. The built-in antenna of claim 1, wherein the plurality of first antenna patterns and the second antenna pattern include a short-circuit resonator and an open-circuit resonator.

8. The built-in antenna of claim 7, wherein:

the open-circuit resonator is arranged on a first surface of the second PCB, and the short-circuit resonator is arranged on a second surface of the second PCB.

* * * * *